(12) United States Patent
Zampaglione (10) Patent No.: US 10,741,249 B1
(45) Date of Patent: Aug. 11, 2020

(54) WORD ALL ZERO MEMORY

(71) Applicant: Synopsys, Inc., Mountain View, CA (US)

(72) Inventor: Michael Anthony Zampaglione, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/365,542

(22) Filed: Mar. 26, 2019

(51) Int. Cl.
  *G11C 16/08* (2006.01)
  *G06F 1/04* (2006.01)
  *G11C 16/32* (2006.01)
  *G11C 8/08* (2006.01)

(52) U.S. Cl.
  CPC ............... *G11C 16/08* (2013.01); *G06F 1/04* (2013.01); *G11C 8/08* (2013.01); *G11C 16/32* (2013.01)

(58) Field of Classification Search
  CPC ........... G11C 16/08; G11C 16/32; G11C 8/08; G06F 1/04
  See application file for complete search history.

(56) References Cited

U.S. PATENT DOCUMENTS

| | | | | |
|---|---|---|---|---|
| 6,868,009 | B1* | 3/2005 | Hung | G11C 16/344 365/185.11 |
| 8,238,192 | B2* | 8/2012 | Nii | G11C 8/08 365/154 |
| 10,347,321 | B1* | 7/2019 | Yamanaka | G11C 8/14 |
| 2003/0214832 | A1* | 11/2003 | Okamoto | G11C 8/08 365/149 |
| 2005/0078519 | A1* | 4/2005 | Shiga | G11C 16/3454 365/185.17 |
| 2005/0141318 | A1* | 6/2005 | Lee | G11C 8/12 365/226 |
| 2016/0049191 | A1* | 2/2016 | Siddiqui | G11C 11/418 365/154 |
| 2018/0158522 | A1* | 6/2018 | Ishii | G11C 8/16 |

* cited by examiner

*Primary Examiner* — Khamdan N. Alrobaie
(74) *Attorney, Agent, or Firm* — Fenwick & West LLP (57) ABSTRACT

Disclosed is a computer memory including a memory array, an address decoder, and a wordline enable circuit. The wordline enable circuit includes a plurality of memory cells, each cell corresponding to a memory row of the memory array. Each memory cell stores a flag indicating whether a data row of the corresponding memory row should have a value of zero. The wordline enable circuit additionally includes multiple outputs, each corresponding to a memory row of the memory array. The wordline enable circuit outputs a signal having the first value (e.g., 1 or HI) through an output corresponding to the input address in response to receiving an input signal having the first value and the flag being stored by the memory cell corresponding to the input address having a first flag value.

20 Claims, 10 Drawing Sheets

WORD ALL ZERO MEMORY

BACKGROUND

1. Field of the Invention

This invention relates generally to computer memory.

2. Description of the Related Art

Computer memory, such as random access memory (RAM), stores information to be used by computer processors. For certain operations, the data stored in the computer memory may include a large number of data words having a value of zero. This is prevalent, for example, in Artificial Intelligence (AI) applications that run Convolutional Neural Networks (CNNs). In these cases, the computer memory receives a request to read a memory address that contains a data word with a value of zero. Substantial energy is used by the computer memory to retrieve and output the word. Additionally, when the computer memory receives a request to store a data word that has a value of zero, substantial energy is used by the computer memory.

Thus, there is a need for a power efficient memory module that can read or store data words having a value of zero, or a predetermined value, with a lowered power consumption.

SUMMARY

The present invention overcomes the limitations of the prior art by incorporating circuitry that controls the operation of a memory array based on flags stored in the control circuitry or the value of an input signal to the computer memory.

In one embodiment, the computer memory includes a memory array, an address decoder, and a wordline enable circuit. The memory array includes multiple memory rows, each configured to store a data word. The address decoder includes an output for each memory row of the memory array. The address decoder is configured to receive an input address and output a signal having a first value (e.g., 1 or HI) through the output corresponding to the received input address.

The wordline enable circuit is coupled to the address decoder and the memory array. The wordline enable circuit receives as inputs the outputs of the address decoder corresponding to each of the memory rows of the memory array.

The wordline enable circuit includes a plurality of memory cells, each cell corresponding to a memory row of the memory array. Each memory cell stores a flag indicating whether a data row of the corresponding memory row should have a value of zero. The wordline enable circuit includes multiple outputs, each corresponding to a memory row of the memory array. The wordline enable circuit outputs a second signal having the first value (e.g., 1 or HI) through an output corresponding to the input address in response to receiving the first signal having the first value and the flag being stored by the memory cell corresponding to the input address has a first flag value.

In another embodiment, the computer memory includes a memory array, an address decoder, and a wordline enable circuit. The memory array includes multiple memory rows, each configured to store a data word. The address decoder includes an output for each memory row of the memory array. The outputs of the address decoder include at least a first output corresponding to a first memory row, the first output having a signal with a first value in response to the input address having a first value and having a second value in response to the input address not having the first value.

The wordline enable circuit includes a plurality of wordline cells. Each wordline cell corresponds to a memory row of the memory array. The plurality of wordline cells includes at least a first wordline cell corresponding to the first memory row. The first wordline cell includes a memory cell storing a flag. The wordline enable circuit outputs a signal having the first value in response to receiving the first output having the first value and the memory cell of the wordline cell storing the flag having a first flag value.

Other aspects include components, devices, systems, improvements, methods, processes, applications and other technologies related to the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Figure 1:
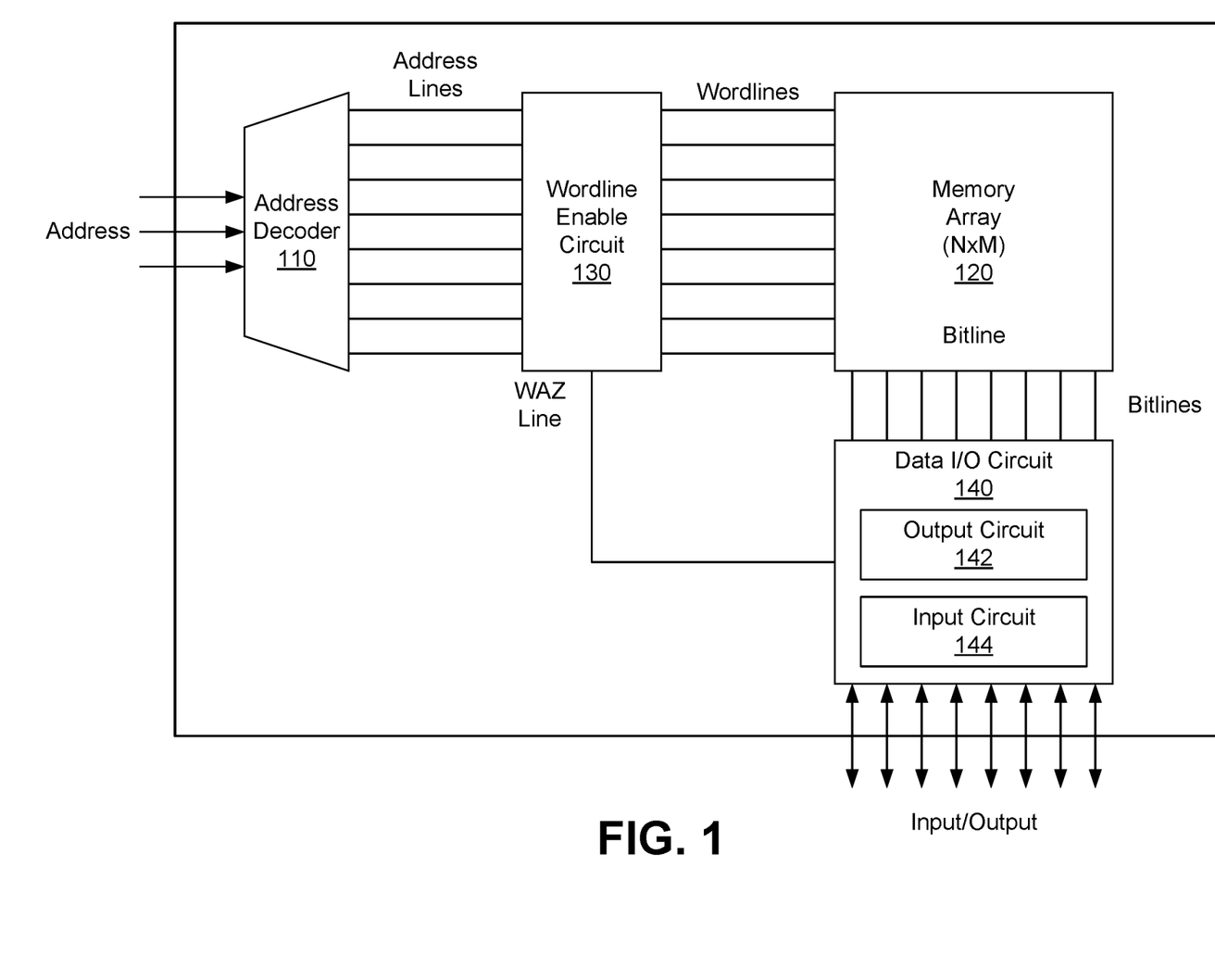
FIG. 1 is a block diagram of a computer memory, according to one embodiment.

FIG. 1 is a block diagram of a computer memory 100, according to one embodiment. The computer memory 100 includes an address decoder 110, a memory array 120, a wordline enable circuit 130, and a data I/O circuit 140. In some embodiments, the computer memory 100 further includes a control circuitry that controls the timing and operation of the various components of the computer memory 100.

The address decoder 110 receives an n-bit address and generates $2^n$ outputs (or less). The address decoder enables one of the outputs that corresponds to the binary value of the input address. The output of the address decoder 110 activates one row of the memory array to allow the computer memory 100 to read or write from the activated row.

The memory array 120 is an N×M array of storage elements. For example, the memory array 120 may be an array of 256 rows by 64 columns (i.e., an array of 256 64-bit words). Each row of the memory array 120 is configured to store an M-bit data word.

The wordline enable circuit 130 stores a flag for each row of the memory array 120. The flags stored by the wordline enable circuit 130 indicates whether the data word associated with the flag is a data word containing all zero bits (i.e., has a value of 0). If a row having a flag indicating an all zero value is requested, the wordline enable circuit 130 bypasses the memory array and instructs the data input/output (I/O) circuit 140 of the computer memory 100 to produce an output without retrieving the requested word from the memory array. As such, energy is saved by not activating the circuitry used for reading the value stored at the requested address.

The data I/O circuit 140 outputs the data word stored at a specified memory address when a read instruction is received, and receives a data word to be stored at a specified memory address when a write instruction is received. When a read instruction is received by the computer memory 100, the data I/O circuit 140 receives an input from the wordline enable circuit 130 to select whether to output a data word received from the memory array 120, or to output a data word having a value of zero.

Moreover, when a write instruction is received, the data I/O circuit 140 determines whether the received data word has a value of zero and informs the wordline enable circuit 130 whether the received data word has a value of zero. That is, on one hand, if the received word has a value of zero, the data I/O circuit 140 outputs a signal having a first value (e.g., 1) to the wordline enable circuit. On the other hand, if the received word does not have a value of zero, the data I/O circuit 140 output a signal having a second value (e.g., 0) to the wordline enable circuit 130.

The data I/O circuit 140 is further coupled to the bitlines of the memory array 120. In some embodiments, if the data I/O circuit 140 determines that the received data word does not have a value of zero, the data I/O circuit 140 provides the received data word to the memory array 120. That is, the data I/O circuit 140 provides each of the bits of the received data word to a corresponding bitline of the memory array 120.

If the data I/O circuit 140 determines that the received data word does have a value of zero, the data I/O circuit does not provide the received data word to the memory array 120. In some embodiments, if the data I/O circuit 140 determines that the received data word does have a value of zero, the data I/O circuit 140 maintains a previous output value such that energy is not spent changing the values of the bitlines of the memory array.

Figure 2:
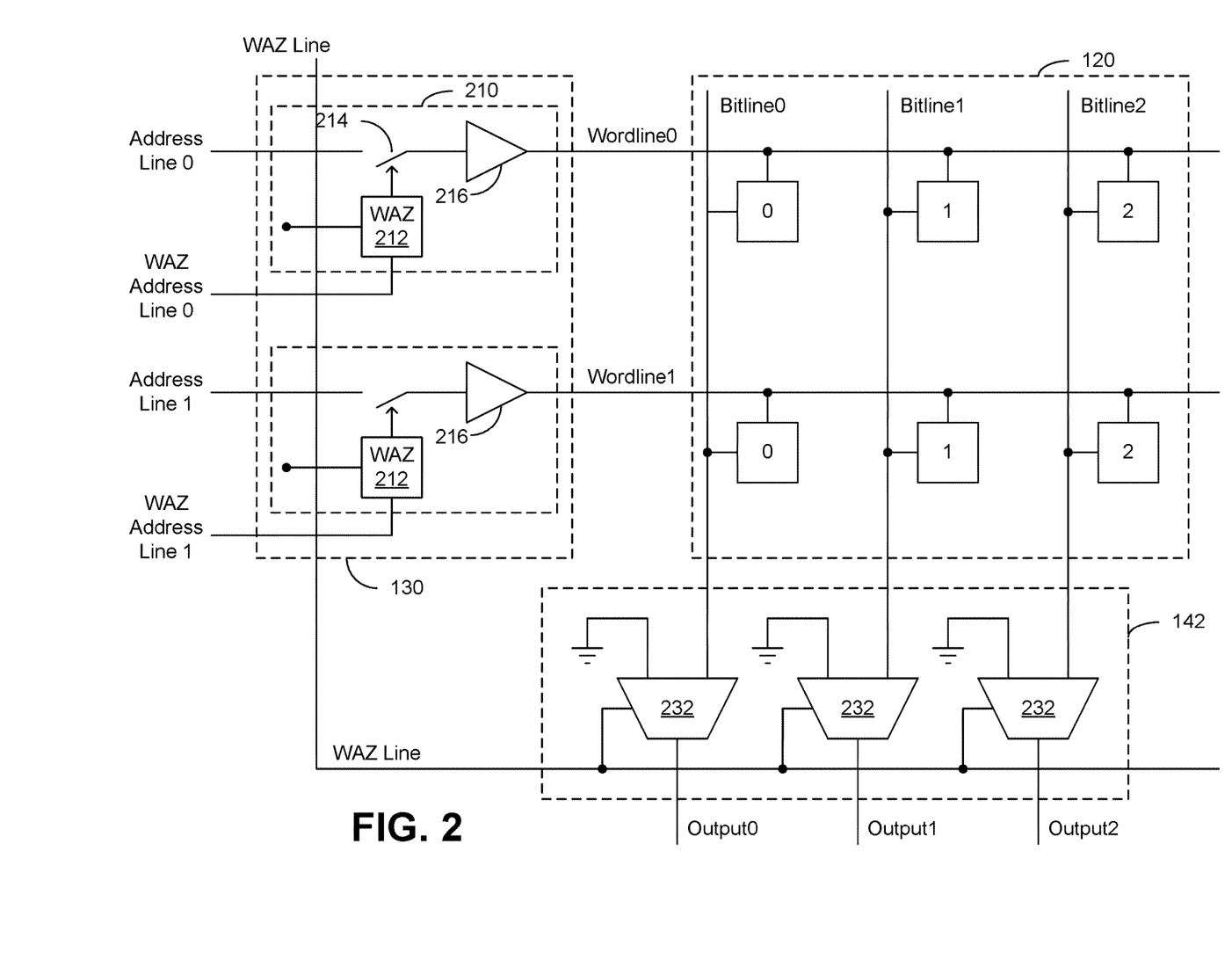
FIG. 2 illustrates a simplified schematic view of the output portion of the computer memory, according to one embodiment.

FIG. 2 illustrates a simplified schematic view of the output portion of the computer memory 100, according to one embodiment. The output portion of the computer memory 100 includes a memory array 120, the wordline enable circuit 130, and the output circuit 142 of the data I/O circuit 140. The simplified schematic view of FIG. 2 shows a 2×3 memory array (i.e., an array having 2 words, each word having a 3-bit width), but any other memory array configuration may be used instead.

The wordline enable circuit 130 includes multiple WAZ blocks 210. Each WAZ block 210 is coupled to a different wordline of the memory array 120. Moreover, all the WAZ blocks are coupled to the WAZ line. Each WAZ block 210 includes a WAZ memory cell 212 (e.g., a 6T SRAM cell), a switch 214, and a buffer 216. In some embodiments, the switch 214 may instead be a logic gate that outputs the value of the address line to the wordline when the value stored in the WAZ memory cell 212 has a first value, and outputs a value of zero when the WAZ memory cell 212 has a second value.

When the WAZ memory cell 212 of a WAZ block 210 stores a value of 1, the switch 214 transmits the value of the address line to the buffer 216. In addition, the buffer 216 amplifies the received signal to provide the signal to a wordline of the memory array. For example, if the address line has a value of 1 (indicating that the wordline is selected to be read or written), the buffer generates a signal with a value of 1 with sufficient power to charge the equivalent capacitance of each of the memory cells connected to the wordline.

When the WAZ memory cell 212 of a WAZ block 210 stores a value of 0, the switch stops transmitting the value of the address line to the buffer 216. In some embodiments, the switch provides a predefined value (e.g., a value of 0). As such, regardless of the value of the address line, the buffer 216 of the WAZ block 210 does not drive the corresponding wordline. As such, the computer memory can save energy by not driving a wordline when the word to be saved has a value of 0.

The output circuit 142 of the data I/O circuit 140 includes a plurality of output selectors 232. The output selectors 232 are logic gates that either output the value received from a corresponding bitline, or a value of 0 (GND or LO) based on the value of the WAZ line. In some embodiments, the output selectors 232 are multiplexers that have a first input coupled to a corresponding bitline of the memory array, and has a second input coupled to GND. In a different embodiment, the output selectors 232 are AND gates that have a first input coupled to a corresponding bitline of the memory array, and has a second input coupled to the WAZ line.

Figure 3:
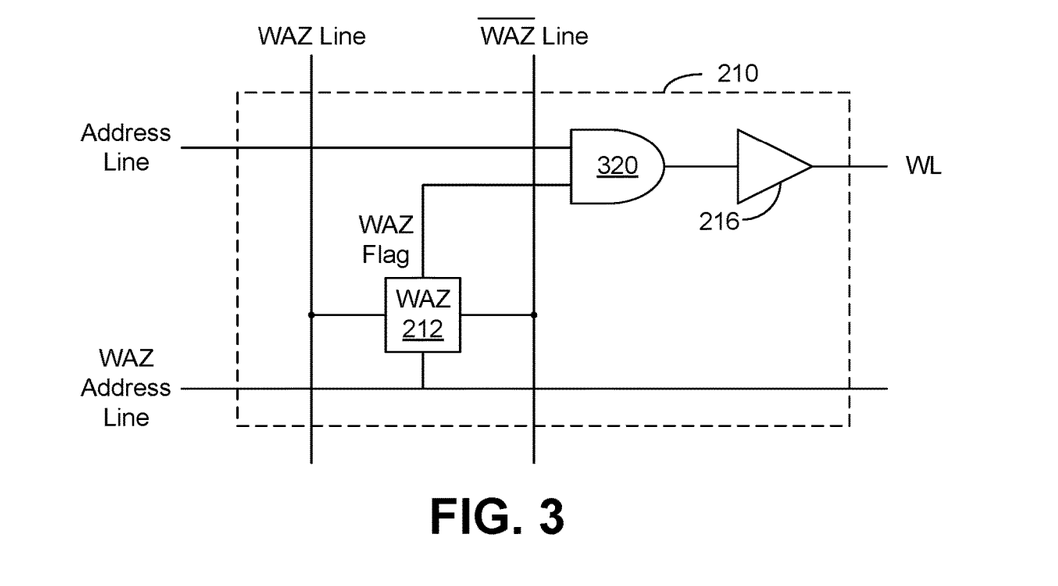
FIG. 3 illustrates an example of the WAZ block, according to one embodiment.

FIG. 3 illustrates an example of the WAZ block 210, according to one embodiment. FIG. 3 illustrates an implementation that uses an AND gate 320 as the switch 214. In this implementation, if the WAZ memory cell 212 stores a value of 0 (i.e., the WAZ Flag output has a value of 0), the AND gate 320 will output a value of zero regardless of the value of the address line. Conversely, if the WAZ memory cell 212 stores a value of 1, (i.e., the WAZ Flag output has a value of 1), the AND gate 320 will propagate the value of the address line to the buffer 216.

In some embodiments, the address line is delayed by one clock cycle with respect to the WAZ address line. This way, the value of the WAZ flag is valid and stable before the AND age 320 generates the wordline output. In some embodiments, the clock used to control the computer memory is generated by doubling an external clock signal. Thus, the read/write operations can be performed in a single external clock cycle. That is, since the address line is delayed by only half of the external clock cycle, the external computing system is agnostic to the additional processing performed by the computer memory.

Figure 4:
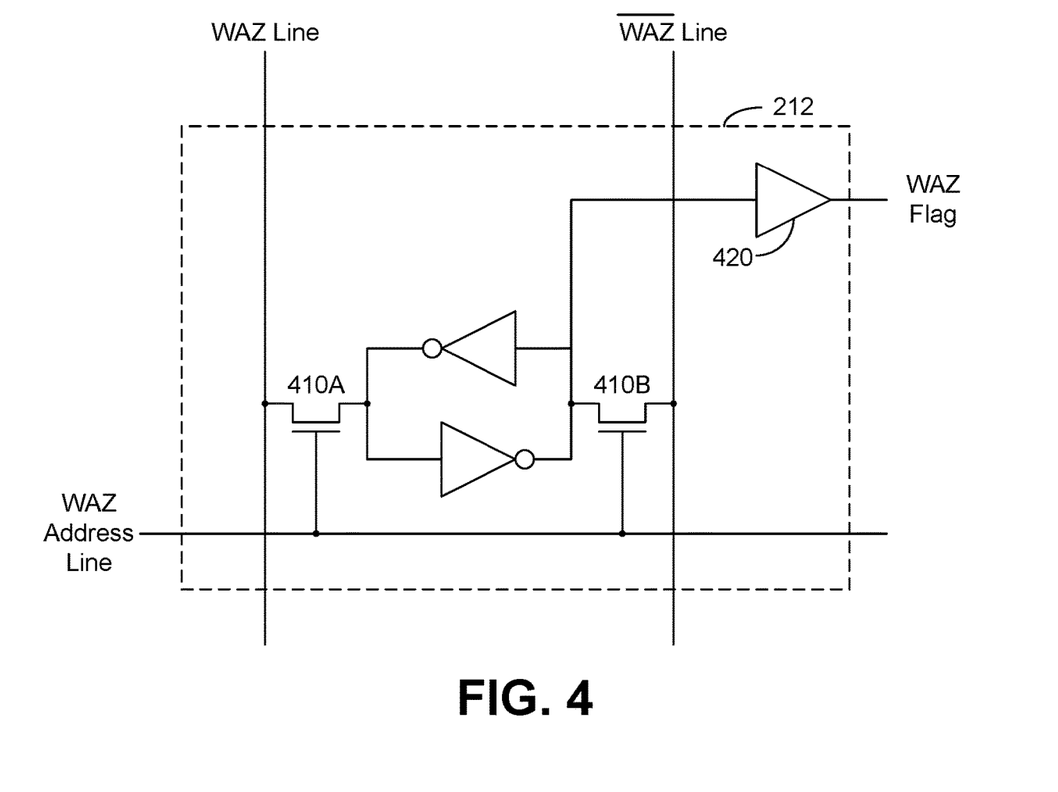
FIG. 4 illustrates an example schematic of the WAZ memory cell of FIG. 3, according to one embodiment.

FIG. 4 illustrates an example schematic of the WAZ memory cell 212 of FIG. 3, according to one embodiment. The WAZ memory cell 212 of FIG. 4 is a static random-access memory (SRAM) implemented with two inverters connected in a loop. The WAZ memory cell 212 includes a pair of transistors 410 that are controlled by the WAZ address line. When the WAZ Address Line is asserted, the transistors 410 turn on, and causes the WAZ memory cell 212 to store the value of the WAZ line. Moreover, the WAZ memory cell 212 includes a buffer 420 that outputs the value stored by the WAZ memory cell.

Figure 5:
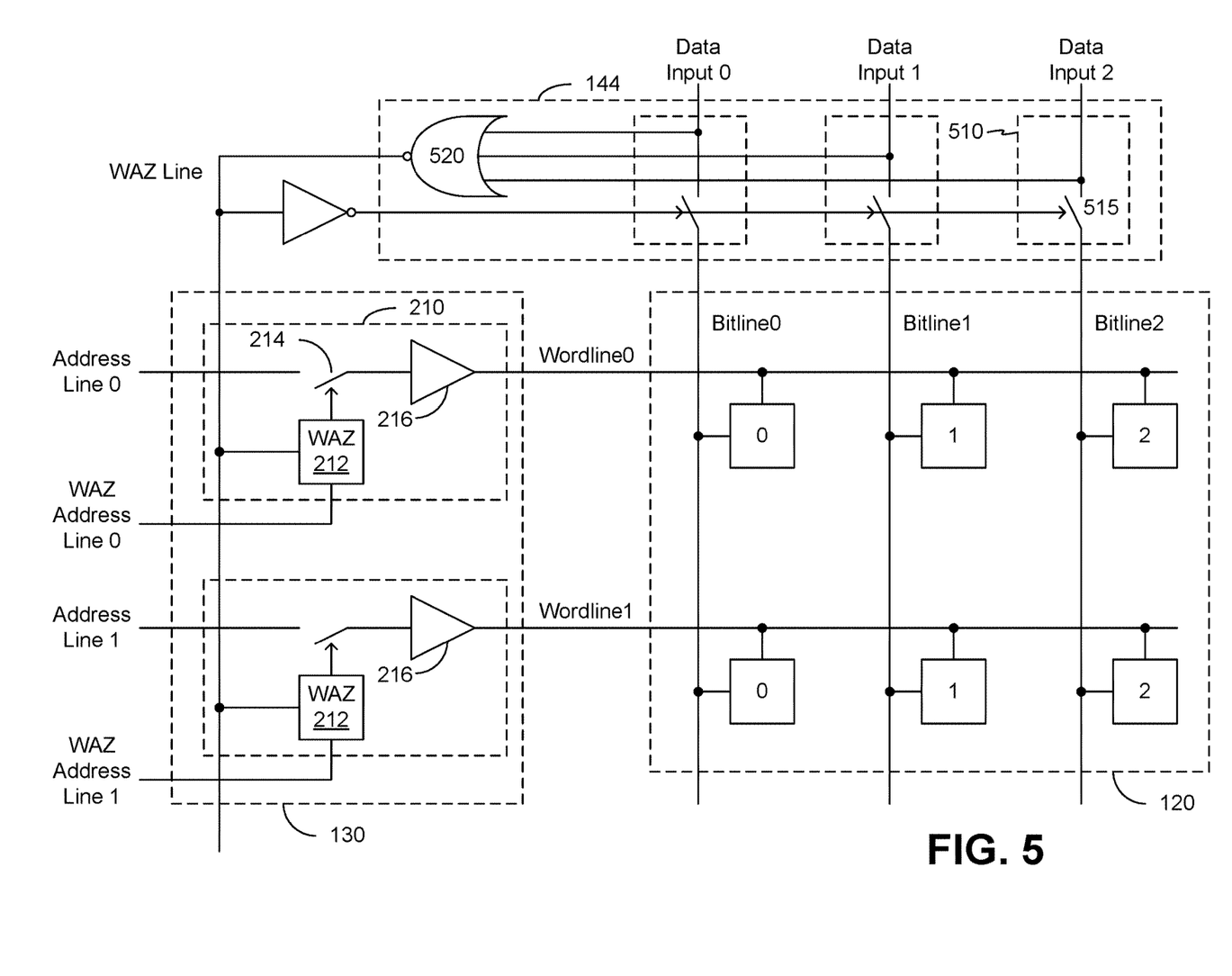
FIG. 5 illustrates a simplified schematic view of the input portion of the computer memory 100, according to one embodiment.

FIG. 5 illustrates a simplified schematic view of the input portion of the computer memory 100, according to one embodiment. The input portion of the computer memory 100 includes a memory array 120, the word enable circuit 130, and the input circuit 144 of the data I/O circuit 140. The input circuit 144 of the data I/O circuit 140 includes multiple input cells 510 and a WAZ comparator 520.

The WAZ comparator 520 receives as inputs each of the data inputs or the computer memory 100 and determines whether every data input has a value of 0. In the example of FIG. 5, the WAZ comparator 520 is a NOR gate that generates an output with a value of 1 when all of the data inputs are 0. In other embodiments, other ways of generating a specific value when all of the data inputs are 0 may be used.

Each input cell 510 includes a switch 515. The switches 515 of the input cells 510 are controlled by the output of WAZ comparator 520. In some embodiments, if the output of the WAZ comparator 520 is 1 (i.e., all of the data inputs are 0), the switches 515 prevents the data inputs from being propagated to the bitlines. If the output of the WAZ comparator 520 is 0 (i.e., not all of the data inputs are 0), the switches 515 propagate the value of the data inputs to the bitlines of the memory array.

In other embodiments, the WAZ comparator 520 generates an output with a value of 0 when all of the data inputs are 0 and generates an output with a value of 1 when not all of the data inputs are 0. Moreover, the switches 515 propagate the data inputs to the bitlines of the memory array 120 when the output of the WAZ comparator 520 is 1 and blocks the data inputs from reaching the bitlines of the memory array 120 when the output of the WAZ comparator 520 is 0.

Figure 6:
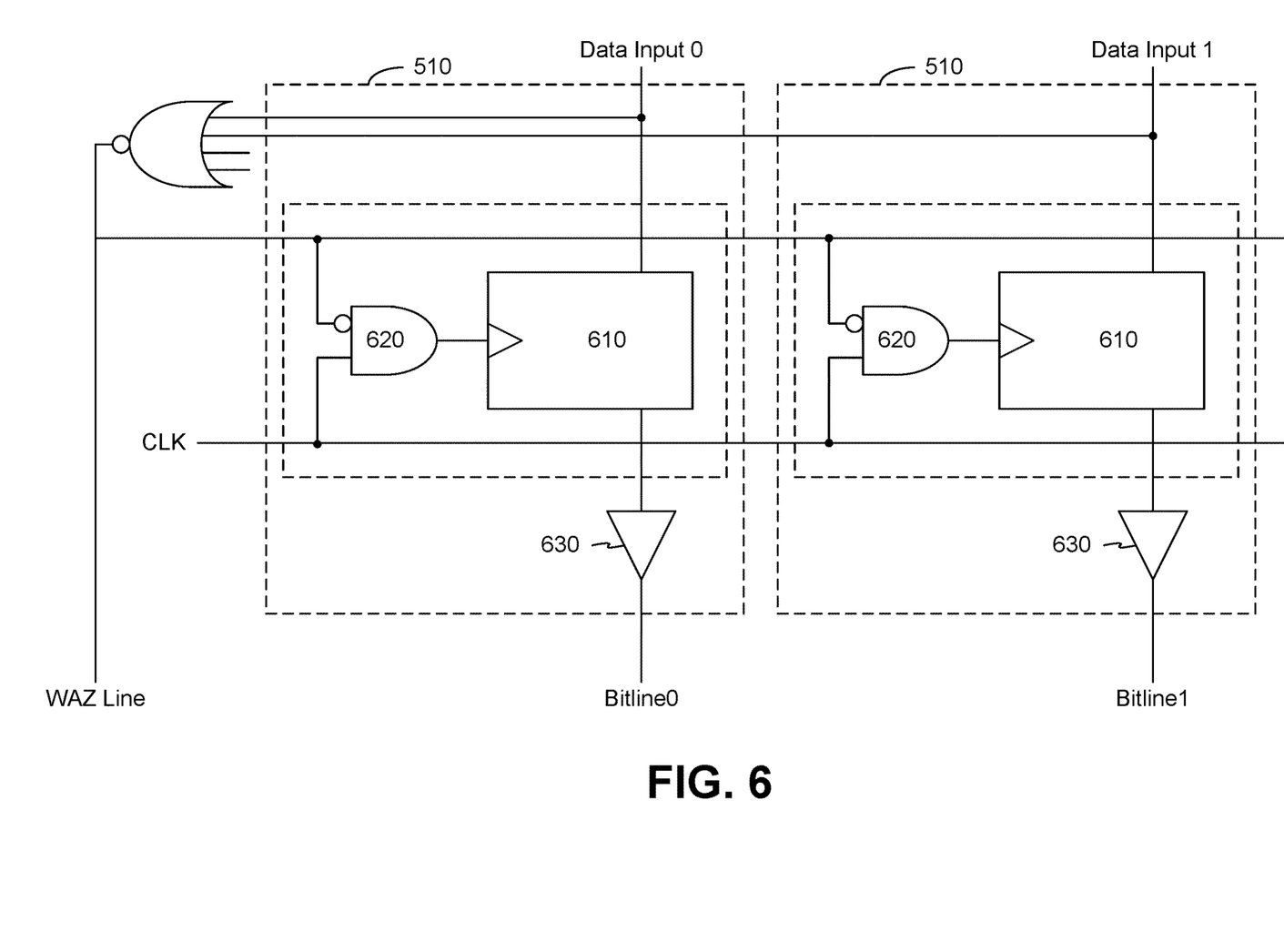
FIG. 6 illustrates a schematic of an input circuit of the data I/O circuit, according to one embodiment.

FIG. 6 illustrates a schematic of an input circuit 144 of the data I/O circuit 140, according to one embodiment. The schematic of FIG. 6 only shows two input cells 510 for the sake of simplicity. However, the input circuit 144 includes an input cell 510 for each bitline in the memory array 120. In the schematic shown in FIG. 6, the switch 515 is implemented using a register 610 that is controlled by a clock signal CLK and the output of the WAZ comparator 520. In particular, register 610 is controlled by an output of an AND gate 620. The AND gate 620 receives as input the inverted version of the output of the WAZ comparator 520 and clock signal CLK.

If the value of the output of the WAZ comparator 520 is 0 (i.e., indicating that not every data input has a value of 0), the AND gate propagates the clock signal CLK. Thus, the register 610 is controlled based on the value of the clock signal CLK. For example, the register 610 may latch the value of the data input when the clock signal CLK transitions from a first value to a second value.

If the value of the output of the WAZ comparator 520 is 1 (i.e., indicating that every data input has a value of 0), the AND gate does not propagate the clock signal CLK. Thus, the register 610 is not activated and does not change the value of its output regardless of the value of the data input or the value of the clock signal CLK.

The implementation of FIG. 6 additionally includes a buffer 630. The buffer receives as an input the output of the register 620. The output of the buffer is coupled to a bitline of the memory array 120. The buffer 630 amplifies the signal received as an input so that it can be provided to each of the memory cells coupled to the corresponding bitline. Since the buffer provides its output to multiple memory cells, each time the buffer toggles its value, a substantial amount of energy is spent. Since the signal provided to the buffer can only change when the output of the WAZ comparator indicates that not every input data has a value of zero, energy is saved by not operating the buffers 630 when the input data has a value of zero.

Figure 7:
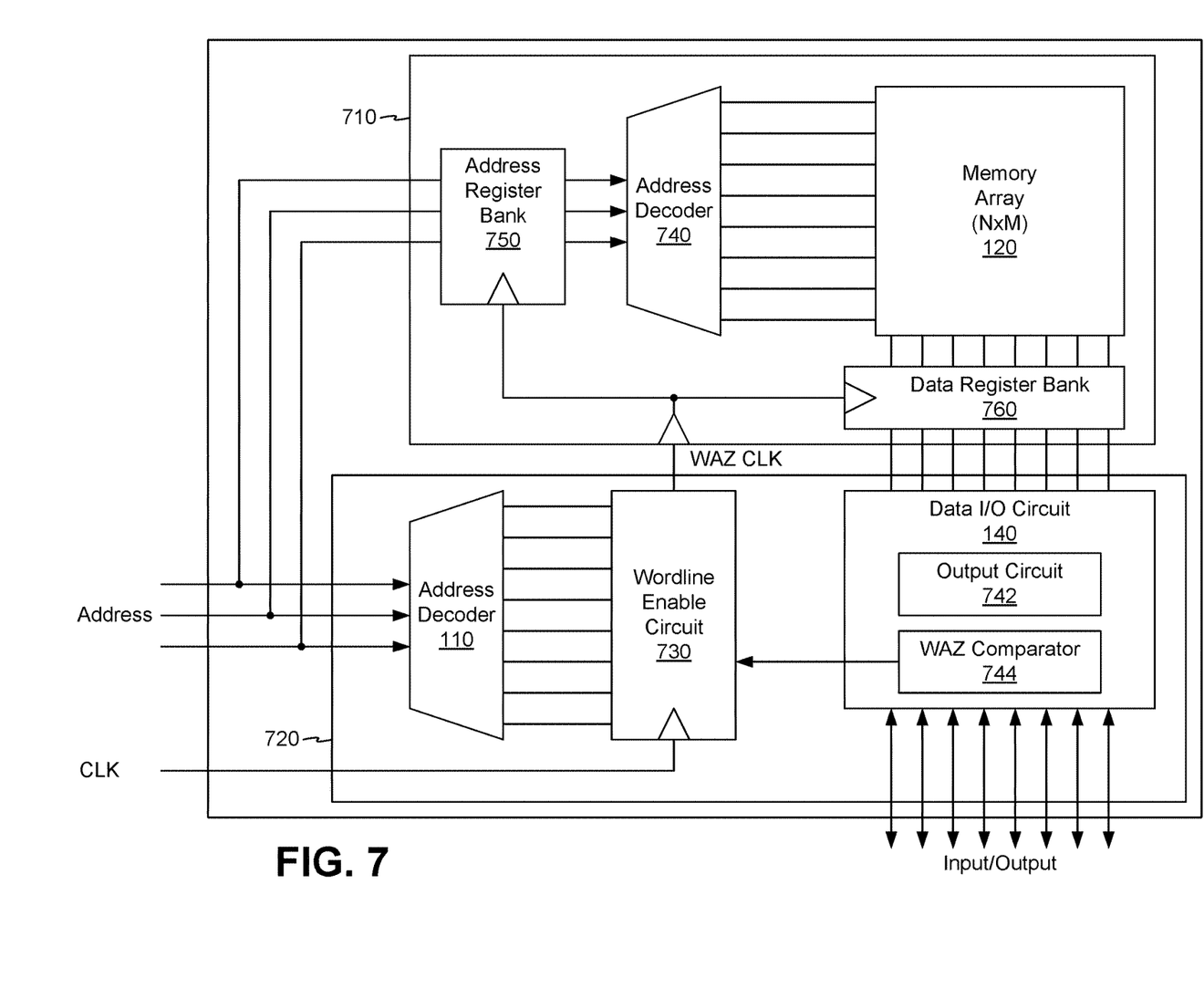
FIG. 7 illustrates an alternative implementation of the computer memory having a WAZ capability, according to one embodiment.

FIG. 7 illustrates an alternative implementation of the computer memory having a WAZ capability, according to one embodiment. The implementation of FIG. 7 includes a computer memory module 710 that does not include WAZ capabilities and a WAZ module 720. The WAZ module 720 receives as inputs an input address, an input word, and a clock from the processor. The WAZ module 720 then generates a clock signal (WAZ CLK) for controlling the memory module 710.

The computer memory 710 includes an address decoder 740, a memory array 120, an address register bank 750, and a data register bank 760. The address register bank 750 and the data register bank 760 operate in response to the WAZ CLK generated by the WAZ module 720. In some embodiments, the address register bank 750 and the data register bank 760 operate in response to different pulse edges of the WAZ CLK. For instance, the address register bank 750 may operate in response to the low to high transition of the WAZ CLK, whereas the data register bank 760 operates in response to the high to low transition of the WAZ CLK. In other embodiments, the data register bank 760 operates with a delayed version of the WAZ CLK. As such, the data register bank 760 latches the data received through the bitlines of the memory array 120 a pre-specified time after the address register bank latches the input address received by the computer memory 710.

During a read operation, the WAZ module 720 determines whether the memory address corresponding to the received input address is flagged as having a value of zero. If the WAZ module 720 determines that the word stored in memory address corresponding to the input address is not flagged as having a value of zero, the WAZ module 720 generates a clock pulse to operate the memory module 710. If the WAZ module 720 determines that the word stored in the memory address corresponding to the input address is flagged as having a value of zero, the WAZ module 720 does not send a clock pulse such that the memory module 710 does not execute any operation.

During a write operation, the WAZ comparator 744 of the data I/O circuit 140 determines whether the input word has a value of zero. If the WAZ comparator 744 determines that the input word does not have a value of zero, the data I/O circuit 140 outputs a signal having a first value (e.g., 0) to the wordline enable circuit 730. The wordline enable circuit 730 then stores a value indicating that the data word corresponding to the input address does not have a value of zero and generates a clock pulse for activating the operation of the memory module 710. In response to the clock pulse, the memory module then stores the input word at the memory row corresponding to the input address.

If the WAZ comparator 744 determines that the input word does have a value of zero, the data I/O circuit 140 outputs a signal having a second value, different than the first value (e.g., 1) to the wordline enable circuit 730. The wordline enable circuit 730 then stores a value indicating that the data word corresponding to the input address has a value of zero. Moreover, the wordline enable circuit 730 does not generate the clock pulse to activate the operation of the memory module 710.

The computer memory 710 receives as inputs the input address, the input word, and the clock signal generated by the WAZ module 720. When the computer memory 710 receives a clock pulse during a read operation, the computer memory 710 reads a data word from the memory row of the memory array corresponding to the input address, and output the read data word. Moreover, when the computer memory 710 receives the clock pulse during a write operation, the computer memory 710 stores the input word in the memory row corresponding to the input address.

Figure 8A:
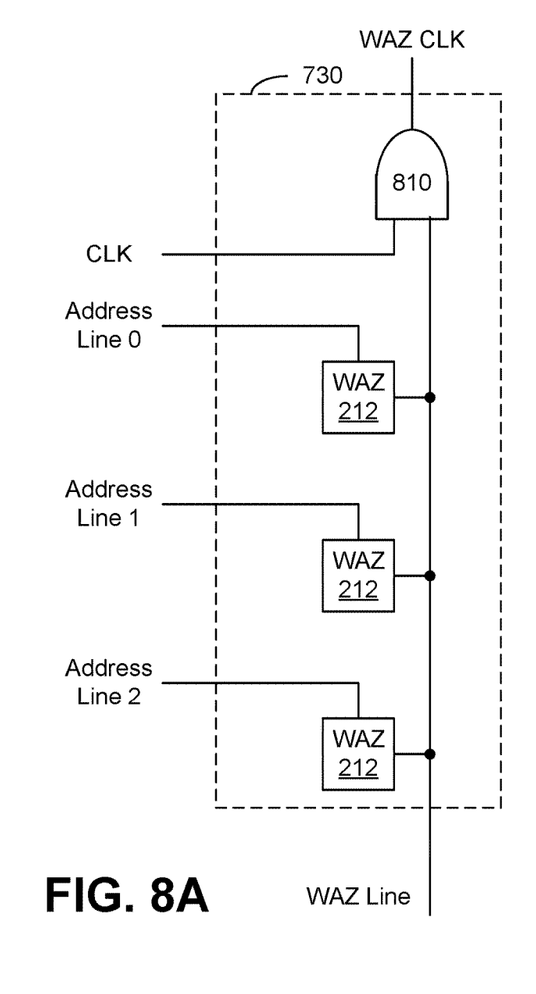
FIG. 8A illustrates an example implementation of the wordline enable circuit.

FIG. 8A illustrates an example implementation of the wordline enable circuit 730. The wordline enable circuit of FIG. 8A includes multiple WAZ memory cells 212 and an AND gate 810. Based on the address line that is asserted, one WAZ memory cell 212 outputs to the WAZ line, the value of the flag indicating whether the data word associated with the memory address corresponding to the asserted address line has a value of zero. The AND gate 810 then propagates the clock CLK based on the value of the WAZ line. If the WAZ line has a value of 1, the AND gate 810 propagates the clock CLK to the WAZ CLK output. Conversely, if the WAZ line has a value of 0, the AND gate 810 blocks the clock CLK and simply outputs a value of 0.

Figure 8B:
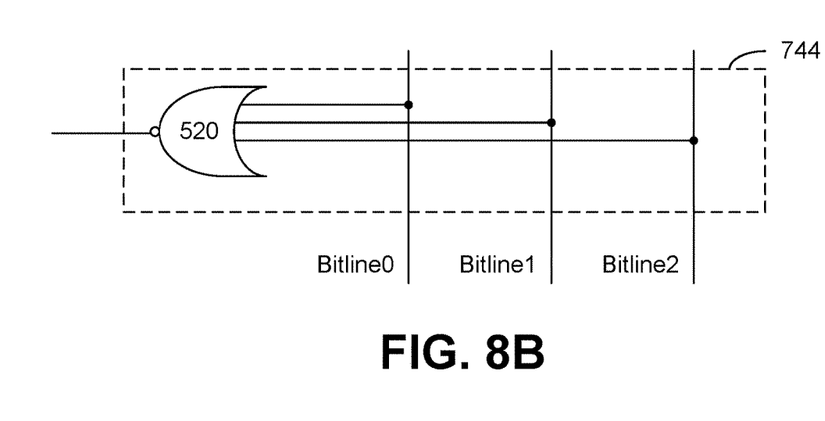
FIG. 8B illustrates an example implementation of the WAZ comparator.
Figure 8C:
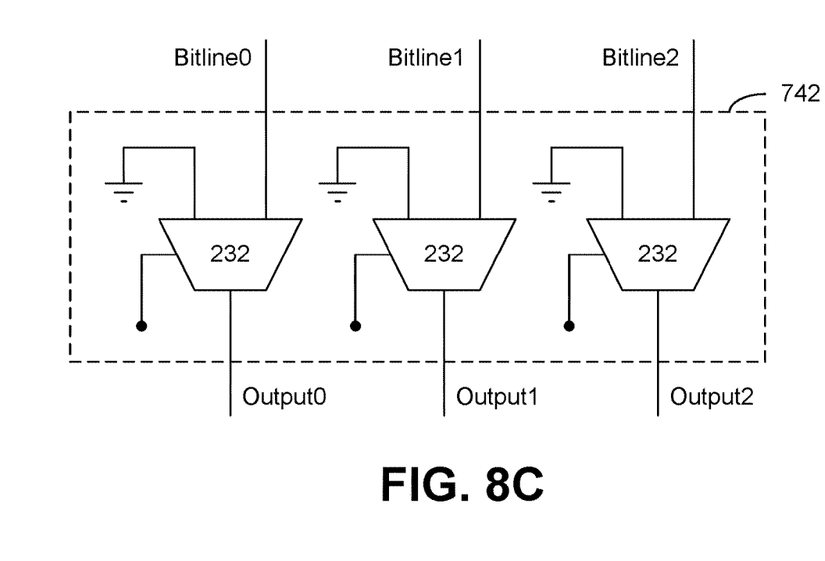
FIG. 8C illustrates an example implementation of the output circuit.

FIG. 8B illustrates an example implementation of the WAZ comparator 744. FIG. 8C illustrates an example implementation of the output circuit 742. The implementation of the WAZ comparator 744 is similar to the implementation of the comparator 520 of FIG. 5. The implementation of the output circuit 742 is similar to the implementation of the output circuit 142 of FIG. 2.

Figure 9:
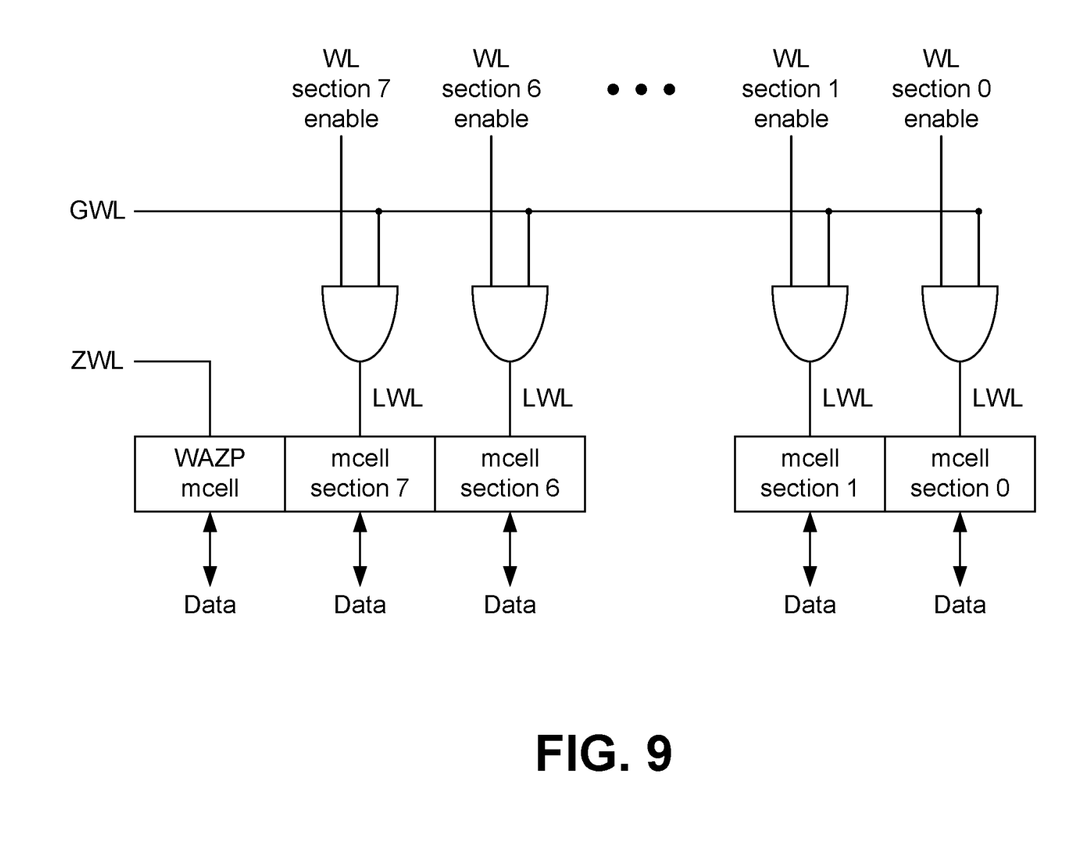
FIG. 9 illustrates another implementation of the computer memory.

FIG. 9 illustrates another implementation of the computer memory. In the embodiment of FIG. 9, a word is split into multiple sections. For example, in FIG. 9, a single word is split into 8 sections, (section 0 through section 7). In this embodiment, instead of having a single WAZ memory cell that stores one bit identifying whether the entire word contains all zero bits, multiple bits, one for each section of the word, is stored identifying whether each section of the word contains all zero bits. For example, a 64-bit word may be split into 8 8-bit (8 1-byte) sections. Then, 8 WAZ bits are stored to identify whether each of the 8-bit segments have a value of zero. Thus, 72 individual memory cells are used for each word in the computer memory.

The computer memory receives a set of wordline enable signals. For instance, in FIG. 9, eight enable signals (WL section 0 enable through WL section 7 enable) are received. Each of the wordline enable signals is combined with a global wordline signal (GWL) to generate individual local wordline signals (LWL). Each of the LWL signals activate one section of the memory word. When LWL is asserted, data is either written into the respective section of the memory word, or data is read from the respective section of the memory word.

Figure 10A:
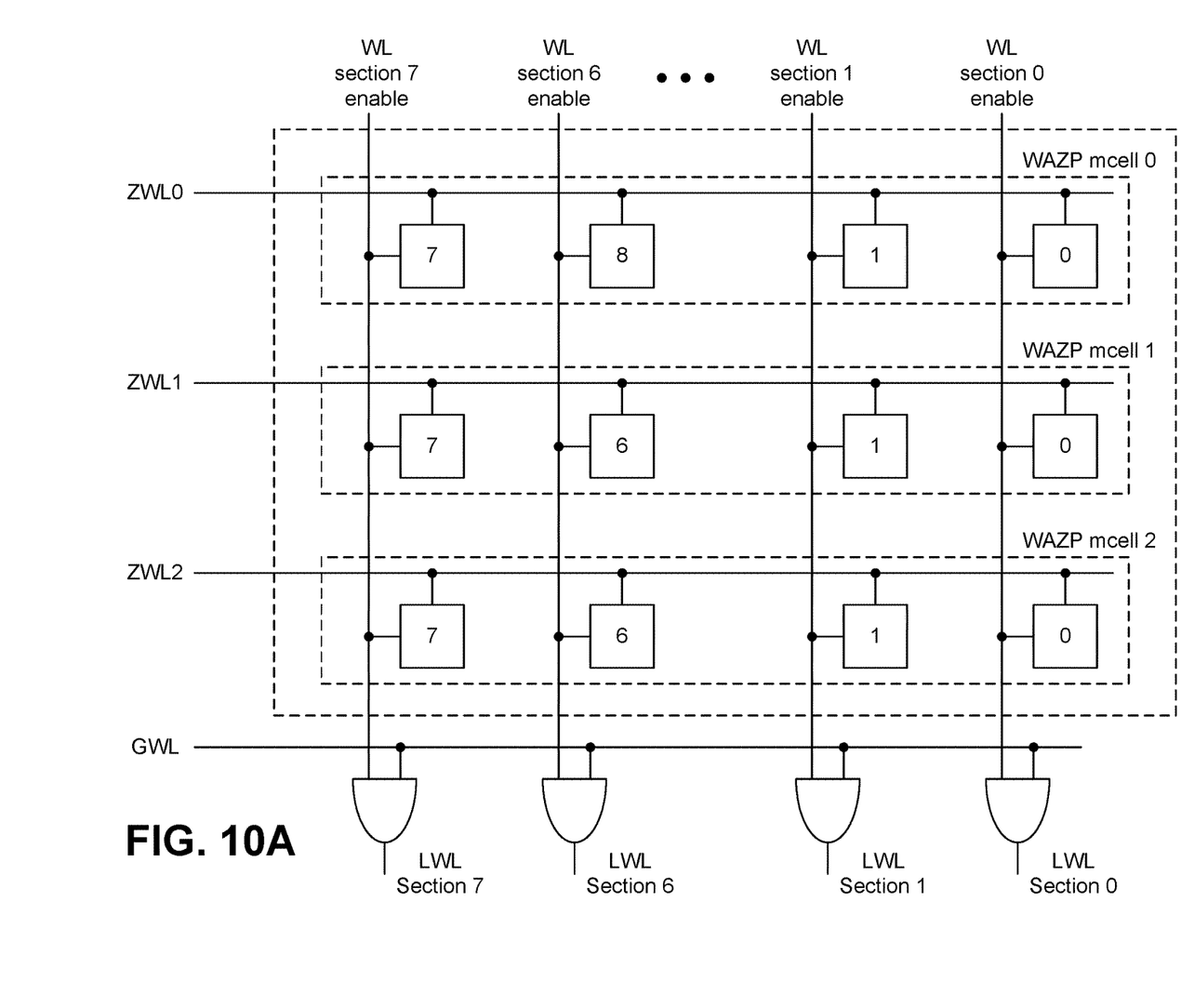
FIG. 10A illustrates a schematic view of the WAZ memory segments, according to one embodiment.

FIG. 10A illustrates a schematic view of the WAZ memory segments, according to one embodiment. In this embodiment, the wordline enable signals correspond to the data output of the WAZP memory section. That is, when the WAZ address line (ZWL) is asserted, the WAZ flags stored in each of the memory cells of the asserted WAZ memory section is outputted to the wordline enable signal lines. For example, when the WAZ address line ZWL1 is asserted, the value of each of the memory cells of WAZP mcell 1 is propagated to a corresponding wordline enable signal (WL section 0 enable through WL section 7 enable).

Figure 10B:
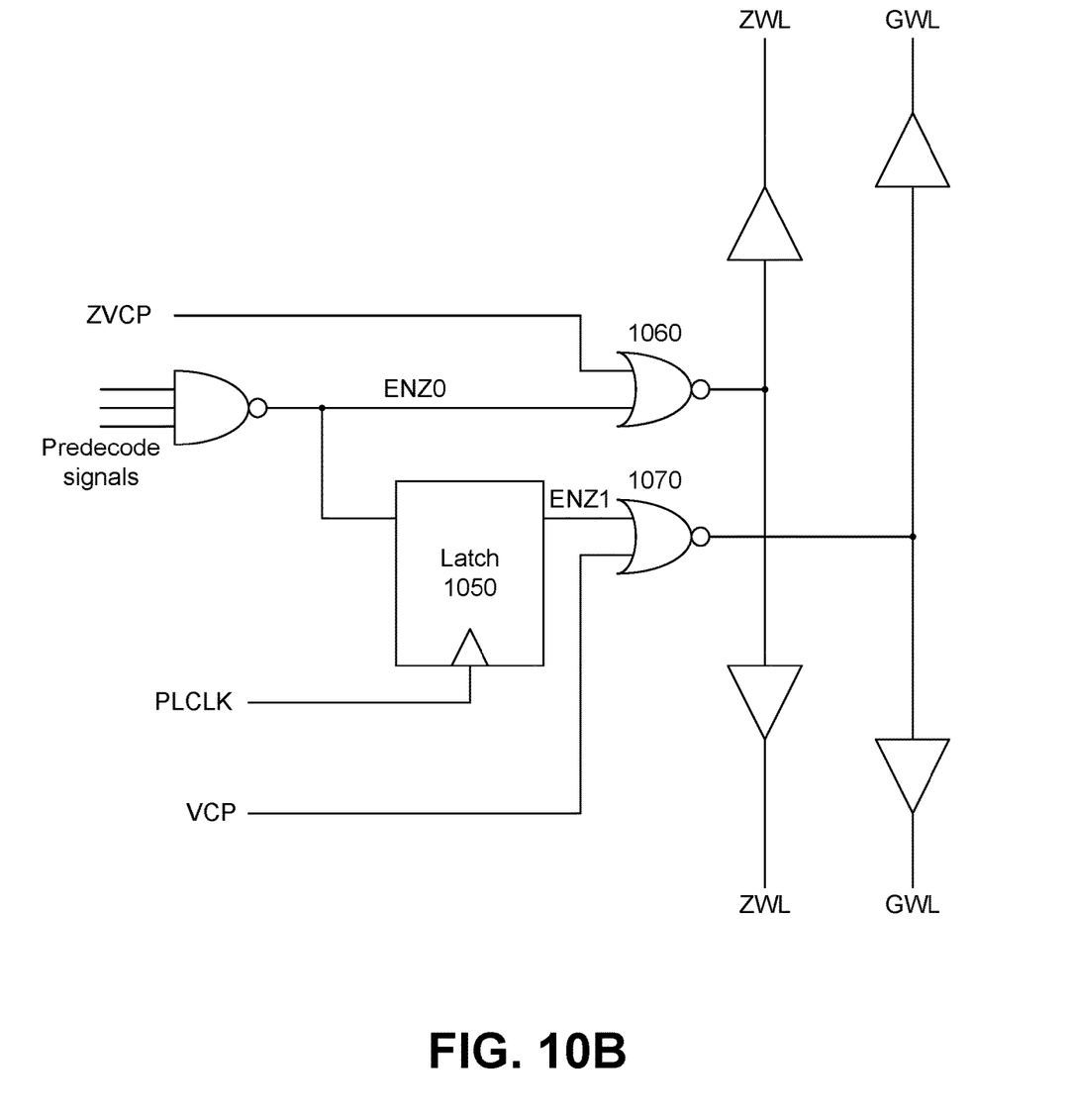
FIG. 10B illustrates a schematic view of a circuitry for generating the WAZ address line (ZWL) signal and the global wordline (GWL) signal.

FIG. 10B illustrates a schematic view of a circuitry for generating the WAZ address line (ZWL) signal and the global wordline (GWL) signal. The wordline generator receives a set of predecode signals that were generated from the external address inputs and generates a first enable signal (ENZ0). Based on the first enable signal ENZ0 and a first vertical clock pulse (ZVCP), the wordline generator generates the WAZ address line signal ZWL. In some embodiments, the wordline generator uses a NOR gate 1060, or another logic gate, and a buffer to generate the ZWL signal.

In addition, the wordline generator includes a latch 1050 to generate a second enable signal ENZ1. The ENZ1 signal is delayed by one clock pulse PLCLK with respect to the ENZ0 signal. Based on the value of the ENZ1 signal and a second vertical clock pulse (VCP), the wordline generator generates the global wordline signal GWL. In some embodiments, the wordline generator uses a NOR gate 1070, or another logic gate, and a buffer to generate the GWL signal.

As such, the GWL signal is delayed by one clock pulse with respect to the ZWL signal. This way, the GWL signal is active when the wordline enable signals (e.g., WL section 0 enable through WL section 7 enable) are valid.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention, as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. A computer memory comprising:
a memory array comprising a plurality of memory rows, each memory row configured to store a data word;
an address decoder configured to receive an input address, the address decoder having a plurality of outputs, each output corresponding to a memory row of the memory array, the address decoder further configured to output a first signal having a first value through an output corresponding to the received input address; and a wordline enable circuit coupled to the address decoder and the memory array, the wordline enable circuit receiving as inputs the plurality of outputs of the address decoder, the wordline enable circuit comprising:
- a plurality of memory cells, each memory cell corresponding to a memory row of the memory array, each memory cell storing a flag, and
- a plurality of outputs, each output of the wordline enable circuit corresponding to a memory row of the memory array and coupled to a corresponding wordline of the memory array,
- the wordline enable circuit, responsive to receiving the first signal having the first value, and a flag stored in a memory cell corresponding to the input address having a first flag value: outputting a second signal having the first value through an output corresponding to the input address.

2. The computer memory of claim 1, wherein the flag stored each memory cell indicates whether a data row of a corresponding memory row should have a value of zero.

3. The computer memory of claim 2, wherein the wordline enable circuit outputs the second signal having the first value through the output corresponding to the input address in response to the first flag value indicating that a data row corresponding to the input address should not have a value of zero.

4. The computer memory of claim 1, wherein the wordline enable circuit further comprises a plurality of switches, each switch coupled to an input of the wordline enable circuit, each switch controlled be an output of a corresponding memory cell of the plurality of memory cells.

5. The computer memory of claim 4, wherein a switch of the plurality of switches is configured to transmit a signal of a corresponding input of the wordline enable circuit in response to a value of a corresponding memory cell storing a flag having the first flag value, and configured to block the signal in response to the flag having a second flag value.

6. The computer memory of claim 4, wherein the plurality of switches are AND gates having a first input coupled to a corresponding input of the wordline enable circuit, and a second input coupled to an output of a corresponding memory cell.

7. The computer memory of claim 4, wherein the plurality of switches are registers having a data input coupled to a corresponding input of the wordline enable circuit, and a clock input controlled by a clock and an output of a corresponding memory cell.

8. The computer memory of claim 5, further comprising:
- a plurality of buffers, each buffer coupled to a corresponding switch, the buffers configured to amplify a signal received from the corresponding switch.

9. The computer memory of claim 1, wherein the wordline enable circuit further comprises a WAZ line output outputting a value of the flag stored in a memory cell corresponding to the received input address.

10. The computer memory of claim 9, wherein the computer memory further comprises:
- an output circuit, the output circuit configured to output a value received from the memory array responsive to the WAZ line outputting a signal having the first flag value, and configured to output a data word having a value of zero responsive to the WAZ line outputting a signal having a second flag value.

11. The computer memory of claim 1, wherein the computer memory further comprises:

- an input circuit, receiving an input data word and configured to determine whether the input data word has a value of zero, the input circuit further configured to generate an output having the first flag value in response to the input data word not having a value of zero, and configured to generate an output having a second flag value in response to the input data word having a value of zero.

12. The computer memory of claim 11, wherein the input circuit comprises:
- a comparator configured to determine whether the input data word has a value of zero, the comparator outputting a signal having the second flag value responsive to the input data word having a value of zero, and outputting a signal having the first flag value responsive to the input data word not having a value of zero,
- a plurality of switches, each switch corresponding to a bitline of the memory array, the switches controlled based on the output of the comparator.

13. The computer memory of claim 11, wherein the switches are registers receiving as a data input bits of the input data word, and receiving as a clock input a combination of a clock and the output of the comparator.

14. A computer memory comprising:
- a memory array comprising a plurality of memory rows, each memory row configured to store a data word;
- an address decoder configured to receive an input address, the address decoder having a plurality of outputs, each output corresponding to a memory row of the memory array, the plurality of outputs including at least a first output corresponding to a first memory row, the first output having a signal with a first value in response to the input address having a first value and having a second value in response to the input address not having the first value;
- a wordline enable circuit coupled to the address decoder and the memory array, the wordline enable circuit receiving as inputs the plurality of outputs of the address decoder, the wordline enable circuit comprising:
  - a plurality of wordline cells, each wordline cell corresponding to a memory row of the memory array, the plurality of wordline cells including at least a first wordline cell corresponding to the first memory row, the first wordline cell comprising:
  - a memory cell storing a flag, and
  - wherein the wordline enable circuit outputs a signal having the first value in response to receiving the first output having the first value and the memory cell of the wordline cell storing the flag having a first flag value.

15. The computer memory of claim 14, wherein the first wordline cell further comprises:
- a switch, the switch being controlled by an output of the memory cell, wherein the switch is configured to transmit the first output signal of the address decoder in response to the memory cell storing the flag having the first flag value, and configured to block the first output signal of the address decoder in response to the memory cell storing the flag having a second flag value.

16. The computer memory of claim 15, wherein the switch is an AND gate having a first input receiving the first output signal of the address decoder, and a second input coupled to an output of the memory cell.

17. The computer memory of claim 15, wherein the switch is a register having a data input receiving the first output signal of the address decoder, and a clock input controlled by a clock and an output of the memory cell.

18. The computer memory of claim 15, wherein the first wordline cell further comprises:
- a buffer configured to amplify a signal received from the switch.

19. The computer memory of claim 14, wherein the computer memory further comprises:
- an output circuit configured to output a value received from the memory array responsive to the wordline enable circuit outputting a select signal having the first flag value, and configured to output a data word having a value of zero responsive to the word enable circuit outputting the select signal having a second flag value.

20. The computer memory of claim 14, wherein the computer memory further comprises:
- an input circuit receiving an input data word and configured to determine whether the input data word has a value of zero, the input circuit further configured to generate an output having the first flag value in response to the input data word not having a value of zero, and configured to generate an output having a second flag value in response to the input data word having a value of zero.

* * * * *